(12) United States Patent
Najafi et al.

(10) Patent No.: US 8,698,292 B2
(45) Date of Patent: Apr. 15, 2014

(54) ENVIRONMENT-RESISTANT MODULE, MICROPACKAGE AND METHODS OF MANUFACTURING SAME

(71) Applicant: The Regents of the University of Michigan, Ann Arbor, MI (US)

(72) Inventors: Khalil Najafi, Ann Arbor, MI (US); Sang-Hyun Lee, Ann Arbor, MI (US); Sang Woo Lee, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 13/930,699

(22) Filed: Jun. 28, 2013

(65) Prior Publication Data
US 2013/0285171 A1   Oct. 31, 2013

Related U.S. Application Data

(60) Division of application No. 13/273,402, filed on Oct. 14, 2011, now Pat. No. 8,476,737, which is a continuation of application No. 12/135,532, filed on Jun. 9, 2008, now Pat. No. 8,049,326.

(60) Provisional application No. 60/942,511, filed on Jun. 7, 2007.

(51) Int. Cl.
*B81B 3/00* (2006.01)
*B81B 1/00* (2006.01)

(52) U.S. Cl.
USPC ........... 257/678; 257/680; 257/682; 257/684; 257/688; 257/698; 257/701; 257/702

(58) Field of Classification Search
USPC ......... 257/678, 680, 682, 684, 688, 698, 701, 257/702, E21.499, E23.174
See application file for complete search history.

(56) References Cited

U.S. PATENT DOCUMENTS

| | | | |
|---|---|---|---|
| 5,668,033 A | 9/1997 | Ohara et al. | |
| 5,917,272 A | 6/1999 | Clark et al. | |
| 6,232,150 B1 | 5/2001 | Lin et al. | |
| 6,338,284 B1 | 1/2002 | Najafi et al. | |
| 6,384,353 B1 | 5/2002 | Huang et al. | |

(Continued)

OTHER PUBLICATIONS

Najafi, Khalil, Micropackagiing Technologies for Integrated Microsystems: Applications to MEMS and MOEMS, Micromachining and Microfabrication Process Technology VIII, Proceedings of SPIE, vol. 4979, 2003, pp. 1-19.

(Continued)

*Primary Examiner* — Matthew W Such
*Assistant Examiner* — David Spalla
(74) *Attorney, Agent, or Firm* — Brooks Kushman P.C.

(57) ABSTRACT

An environment-resistant module which provides both thermal and vibration isolation for a packaged micromachined or MEMS device is disclosed. A microplatform and a support structure for the microplatform provide the thermal and vibration isolation. The package is both hermetic and vacuum compatible and provides vertical feedthroughs for signal transfer. A micromachined or MEMS device transfer method is also disclosed that can handle a wide variety of individual micromachined or MEMS dies or wafers, in either a hybrid or integrated fashion. The module simultaneously provides both thermal and vibration isolation for the MEMS device using the microplatform and the support structure which may be fabricated from a thin glass wafer that is patterned to create crab-leg shaped suspension tethers or beams.

21 Claims, 10 Drawing Sheets

(56) References Cited

U.S. PATENT DOCUMENTS

| | | |
|---|---|---|
| 6,391,742 B2 | 5/2002 | Kawai |
| 6,436,853 B2 | 8/2002 | Lin et al. |
| 6,569,754 B2 | 5/2003 | Wong et al. |
| 6,667,558 B2 | 12/2003 | Wong et al. |
| 6,673,697 B2 | 1/2004 | Ma et al. |
| 6,731,180 B1 | 5/2004 | Clark et al. |
| 6,815,827 B2 | 11/2004 | Vieux-Rochaz et al. |
| 6,903,452 B2 | 6/2005 | Ma et al. |
| 6,929,974 B2 * | 8/2005 | Ding et al. ............... 438/106 |
| 6,939,778 B2 | 9/2005 | Harpster et al. |
| 6,942,750 B2 | 9/2005 | Chou et al. |
| 6,954,301 B2 | 10/2005 | Nguyen et al. |
| 7,029,829 B2 | 4/2006 | Stark et al. |
| 7,045,868 B2 | 5/2006 | Ding et al. |
| 7,061,086 B2 | 6/2006 | Ferreiro et al. |
| 7,088,032 B2 | 8/2006 | Oita et al. |
| 7,098,117 B2 | 8/2006 | Najafi et al. |
| 7,196,405 B1 | 3/2007 | Ferreiro et al. |
| 7,303,978 B2 | 12/2007 | Ito |
| 7,309,865 B2 * | 12/2007 | Ikushima et al. ........... 250/338.1 |
| 7,432,586 B2 | 10/2008 | Zhao et al. |
| 7,551,048 B2 | 6/2009 | Iwata et al. |
| 7,700,957 B2 | 4/2010 | Bieck et al. |
| 8,288,835 B2 * | 10/2012 | Quevy et al. .................. 257/415 |
| 2002/0185712 A1 | 12/2002 | Stark et al. |
| 2004/0067604 A1 | 4/2004 | Ouellet et al. |
| 2005/0285482 A1 * | 12/2005 | Oita et al. ..................... 310/343 |
| 2007/0277620 A1 | 12/2007 | Melamud et al. |
| 2008/0106347 A1 | 5/2008 | Asamura et al. |

OTHER PUBLICATIONS

Yoon, Sang Won, et al., Shock Protection Using Soft Coatings as Shock Stops, Solid-State Sensors, Actuators and Microsystems Workshop, Hilton Head Island, South Carolina, Jun. 4-8, 2006, pp. 396-399.

Mitchell, Jay, et al., Long-Term Reliability, Burn-In and Analysis of Outgassing In Au-Si Eutectic Wafer-Level Vacuum Packages, Solid-State Sensors, Actuators and Microsystems Workshop, Hilton Head Island, South Carolina, Jun. 4-8, 2006, pp. 376-379.

Welch, III, Warren, et al., Transient Liquid Phase (TLP) Bondinig for Microsystem Packaging Applications, The 13th International Conference on Solid-State Sensors, Actuators and Microsystems, Seoul, Korea, Jun. 5-9, 2005, pp. 1350-1353.

Chae, Junseok, et al., Wafer-Level Vacuum Package With Vertical Feedthroughs, IEEE, 2005, pp. 548-551.

Monajemi, Pejman, et al., A Low-Cost Wafer-Level Mems Packaging Technology, IEEE, 2005, pp. 634-637.

Monajemi, Pejman, et al., Wafer-Level MEMS Packaging Via Thermally Released Metal-Organic Membranes, Institute of Physics Publishing, Journal of Micromechanics and Microengineering, vol. 16, 2006, pp. 742-750.

Lee, Sang-Hyun, et al., Low-Power Thermal Isolation for Environmentally Resistant Microinstruments, IEEE, 2005, pp. 532-535.

Hopcroft, M.A., et al., Temperature Compensation of a MEMS Resonator Using Quality Factor as a Thermometer, MEMS 2006, Istanbul, Turkey, Jan. 22-26, 2006, pp. 222-225.

Jha, Chandra Mohan, et al., Thermal Isolation of Encapsulated MEMS Resonators, Journal of Microelectromechanical Systems, vol. 17, No. 1, Feb. 2008, pp. 175-184.

Asamura, Fumio, et al., Temperature Coefficients Improvements of VHG Oscillator Circuit for OCXO, IEEE, 2007, Japan, pp. 230-233.

Li, Xinghua, et al., High Density Electrical Feedthrough Fabricated by Deep Reactive ION Etching of Pyrex Glass, IEEE 2001, Japan, pp. 98-101.

Yoon, S.W., et al, Shock Protection Using Integrated Nonlinear Spring Shock Stops, MEMS 2006, Istanbul, Turkey, Jan. 22-26, 2006, pp. 702-705.

Yoon, Sang Won, et al., Novel Integrated Shock Protection for MEMS, The 13th International Conference on Solid-State Sensors, Actuators and Microsystems, Seoul, Korea, Jun. 5-9, 2005, pp. 396-400.

Cheng, Y.T., et al., Vacuum Packaging Technology Using Localized Aluminum/Silicon-to-Glass Bonding, IEEE 2001, Berkley, California, pp. 18-21.

Slikkerveer, P.J., et al., High Quality Mechanical Etching of Brittle Materials by Powder Blasting, Elsevier Science, Sensors and Actuators, No. 85, 2000, pp. 296-303.

\* cited by examiner

Recess & Shield Metal Layer
*Fig. 2a*
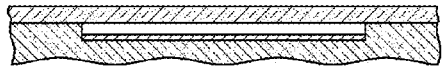
Bonding
*Fig. 2b*
VIA Formation
*Fig. 2c*
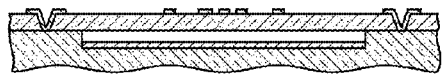
VIA & Contact Metal
*Fig. 2d*
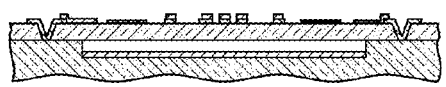
Electrical Interconnections
*Fig. 2e*
Isolation Platform and Isolation Suspension Pattern
*Fig. 2f*
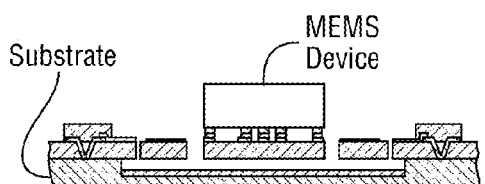
MEMS Device Transfer
*Fig. 2g*
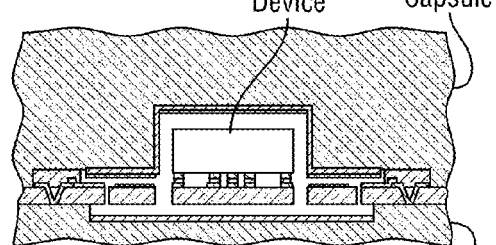
Encapsulation
*Fig. 2h*
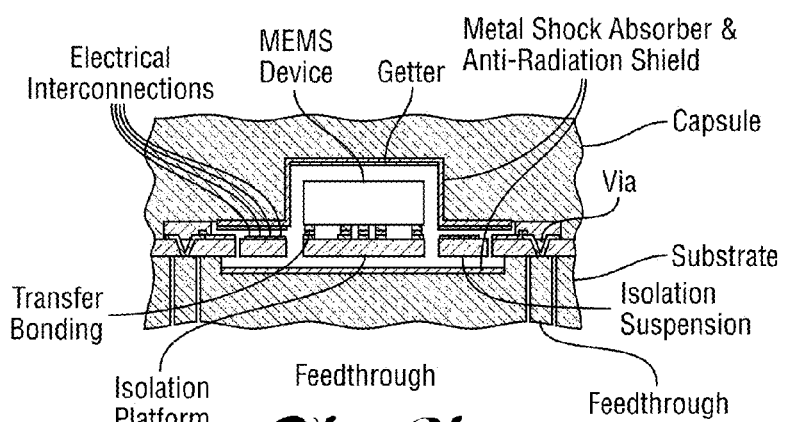
*Fig. 2i*

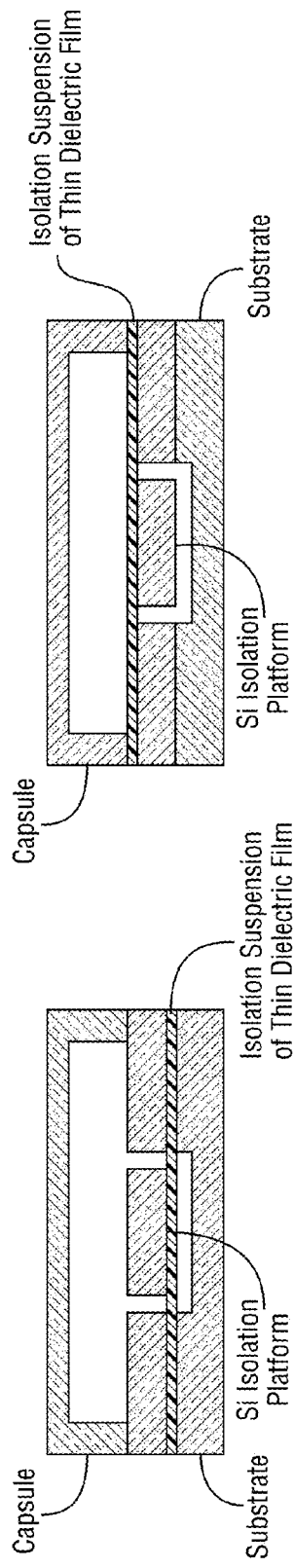
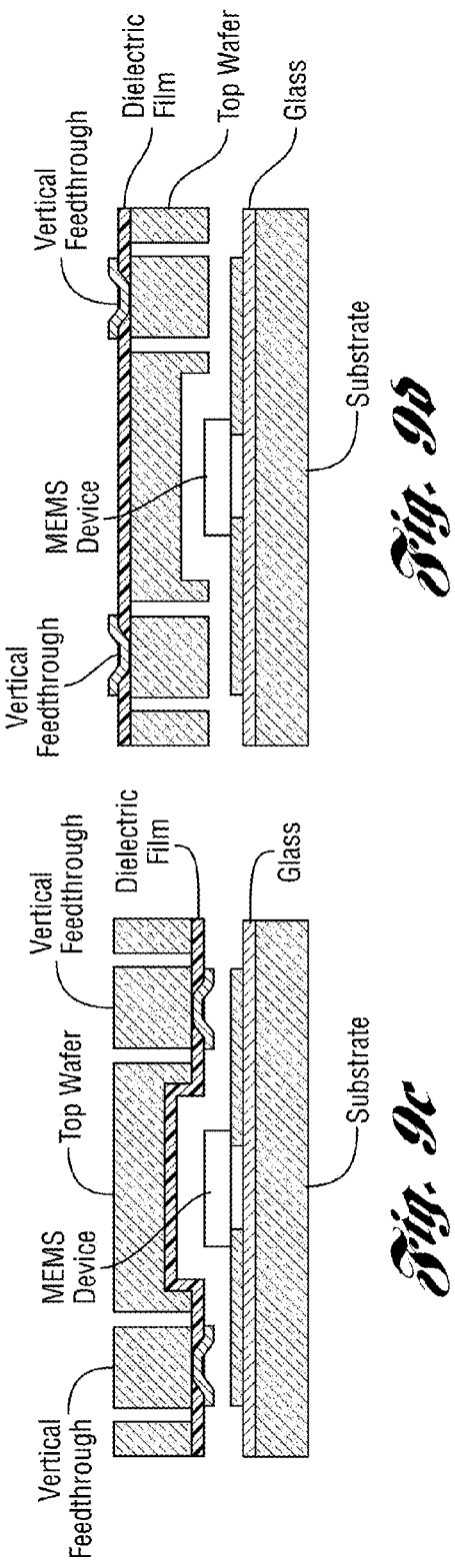
Fig. 9a
Fig. 9b
Fig. 9c
Fig. 9d

ENVIRONMENT-RESISTANT MODULE, MICROPACKAGE AND METHODS OF MANUFACTURING SAME

CROSS-REFERENCE TO RELATED APPLICATION

This application is a division of U.S. application Ser. No. 13/273,402 filed Oct.14, 2011, which is a continuation of U.S. application Ser. No. 12/135,532 filed Jun. 9, 2008, now U.S. Pat. No. 8,049,326 granted Nov. 1, 2011, which claims the benefit of U.S. provisional application No. 60/942,511 entitled "Generic Environment-Resistant Package For MEMS" filed Jun. 7, 2007.

STATEMENT REGARDING FEDERALLY SPONSORED RESEARCH OR DEVELOPMENT

This invention was made with government support under W31P4Q-04-1-R001, awarded by the Army Aviation and Missile Command. The government has certain rights in the invention.

BACKGROUND OF THE INVENTION

1. Field of the Invention

This invention relates to an environment-resistant modules, micropackages and methods of manufacturing same.

2. Background Art

The following references are cited herein:

[1] K. Najafi, "Micropackaging Technologies for Integrated Microsystems: Applications to MEMS and MOEMS," *Proceedings of SPIE*, vol. 4979, p. 1, 2003.

[2] S. W. Yoon, S. Lee, N.C. Perkins, and K. Najafi, "Shock Protection Using Soft Coating as Shock Stops," in *Solid-State Sensors, Actuators, and Microsystems Workshop*, Hilton Head Island, S.C., 2006, pp. 396-399.

[3] J. Mitchell, G. R. Lahiji, and K. Najafi, "Long-term Reliability, Burn-in and Analysis of Outgassing in Au—Si Eutectic Wafer-level Vacuum Packages," in *Tech. Dig. Solid-State Sensors, Actuators, and Microsystems Workshop*, Hilton Head Island, S.C., June 2006, pp. 376-379.

[4] W. Welch III, J. Chae, S.-H. Lee, N. Yazdi, and K. Najafi, "Transient Liquid Phase (TLP) Bonding for Microsystem Packaging Applications," *Solid-State Sensors, Actuators and Microsystems*, 2005. *Digest of Technical Papers. TRANSDUCERS '05. The 13th International Conference*, vol. 2, pp. 1350-1353, 2005.

SUMMARY OF THE INVENTION

An object of at least one embodiment of the present invention is to provide an environment-resistant module, a micropackage and methods of manufacturing same.

In carrying out the above object and other objects of the present invention, an environment-resistant module including a packaged micromachined or MEMS device is provided. The module includes a micromachined or MEMS device including at least one bonding site and a package having an inner surface which forms a cavity and an outer surface which communicates with the environment. The module further includes a microplatform or isolation platform located within the cavity. The microplatform includes at least one bonding site. The device is coupled to the microplatform at their respective bonding sites. The module still further includes a flexible, thermally isolating support structure to support the microplatform and the device within the cavity. The microplatform and support structure provide both thermal and vibration isolation of the device. The module further includes a path of electrically conductive material formed on the microplatform and on the support structure.

The package may include a substrate and a capsule connected to the substrate at a bonding area to at least partially form the cavity.

The package may completely encase the microplatform and the device to allow hermetic or vacuum encapsulation of the microplatform and the device.

The module may include at least one feedthrough through the package to electrically connect the conductive material to the environment.

The at least one feedthrough may include a vertical or a horizontal feedthrough.

The vertical feedthrough may extend through the substrate or the capsule.

The support structure and the microplatform may be defined by a layer of a wafer such as a glass wafer.

The substrate may include a wafer such as a semiconductor wafer.

The support structure may include a plurality of isolation suspension beams or tethers.

The module may further include a heater and a temperature sensor formed on the microplatform.

The module may still further include at least one shock absorption layer formed inside the package.

The module may further include at least one anti-radiation shield formed inside the package.

The module may still further include a getter layer formed inside the package.

At least a portion of the package may be optically transparent.

At least a portion of the package may be open to the environment.

Further in carrying out the above object and other objects of the present invention, a micropackage is provided. The micropackage includes a semiconductor wafer and an insulating layer or film bonded to the wafer. The insulating layer or film has a hole which extends completely therethrough. Electrically conductive material is formed in the hole and is electrically connected to an isolated portion of the wafer. The conductive material and the isolated portion of the wafer form a substantially vertical feedthrough for signal transfer through the package.

The wafer may at least partially form a substrate or a capsule of the package.

Still further in carrying out the above object and other objects of the present invention, a method of making a module is provided. The method includes providing a micromachined or MEMS device including at least one bonding site. The method further includes providing a substrate and providing a microplatform including at least one bonding site. The method still further includes providing a flexible support structure to support the microplatform above the substrate, aligning the respective bonding sites and bonding the microplatform to the device at the respective bonding sites.

The support structure may be flexible and the step of bonding may include flexing the support structure above the substrate. The substrate prevents flexing of the support structure beyond a predetermined amount.

At least one embodiment of a generic, wafer-level environment-resistant microinstruments (i.e., micromachined or MEMS devices) package and related processes are provided. This unique technique provides thermal and mechanical isolation from the environment, which may deteriorate the device performance. It also can package and handle a wide variety of individual MEMS chips or wafers in either a hybrid or integrated fashion, using a new and novel MEMS die transfer/assembly technique. The microinstrument is batch integrated/transferred onto a microplatform and suspended over a substrate wafer by the thermal and mechanical isolation suspensions. The microinstrument is then encapsulated in a cavity to provide vacuum or hermetic sealing. Microheaters and temperature sensors can be integrated to maintain the microinstruments at a fixed temperature (oven-control). The electrical signal leads can be defined vertically or laterally.

Potential application areas using this technique are:

1. Low-power oven-controlled oscillator/resonator packaging.
2. High sensitive/performance inertial sensor packaging.
3. High performance pressure sensor or microphone packaging.
4. Optoelectric sensor packaging.
5. High performance IR sensor packaging.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1a is a side sectional view while FIG. 1b is a perspective view, partially broken away;

FIGS. 2a-2i are side schematic views, partially broken away, illustrating the environment-resistant microinstrument package process flow or method of at least one embodiment of the present invention;

FIG. 2j is an exploded perspective view, partially broken away, of the resulting package;

FIGS. 3a-3d are SEM pictures or views of a via hole through glass with a contact metal layer; FIG. 3a is a side view; FIG. 3b is an enlarged view of a portion of FIG. 3a; FIG. 3d is a top view; and FIG. 3c is an enlarged view of a portion of FIG. 3a;

FIG. 4c is a picture or view of a transferred MEMS device on a platform supported by the suspensions;

FIG. 5c is an enlarged picture of a portion of FIG. 5b;

FIG. 8a illustrates vacuum (hermetic) encapsulation; FIG. 8b illustrates vertical feedthroughs through the substrate; FIG. 8c illustrates the transfer method; FIG. 8d illustrates both thermal and vibration isolation; FIG. 8e illustrates a second level vibration isolation; FIG. 8f illustrates the package with an outlet; FIG. 8g illustrates the package with a transparent window; FIG. 8h illustrates the package which utilizes a SOG (silicon-on-glass) method;

FIGS. 9a and 9b are side sectional views of a package with an isolation platform made of silicon (Si) and isolation suspension made of a thin dielectric film; FIG. 9a shows the platform above the suspension while FIG. 9b shows the platform below the suspension; and FIGS. 9c and 9d are side sectional views of a package with vertical feedthroughs on the top wafer.

DETAILED DESCRIPTION OF THE PREFERRED EMBODIMENT(S)

Existing micromachined or MEMS device packages have not been able to provide advanced isolation functionalities, for example, from temperature and vibration in efficient ways. Technical issues are addressed herein for making advanced isolation possible as well as making the developed technology as generic as possible so it can be applied to various applications without significant change.

A generic vacuum package that can suit a number of different devices and applications, and that can provide isolation from environmental disturbances such as temperature and vibration will be of value for many MEMS devices [1].

A new environmentally isolated package design, a generic transfer approach for the integration of monolithic and hybrid MEMS into the package, and new vertical feedthroughs for signal transfer are provided herein.

Package Design

Figure 1A:
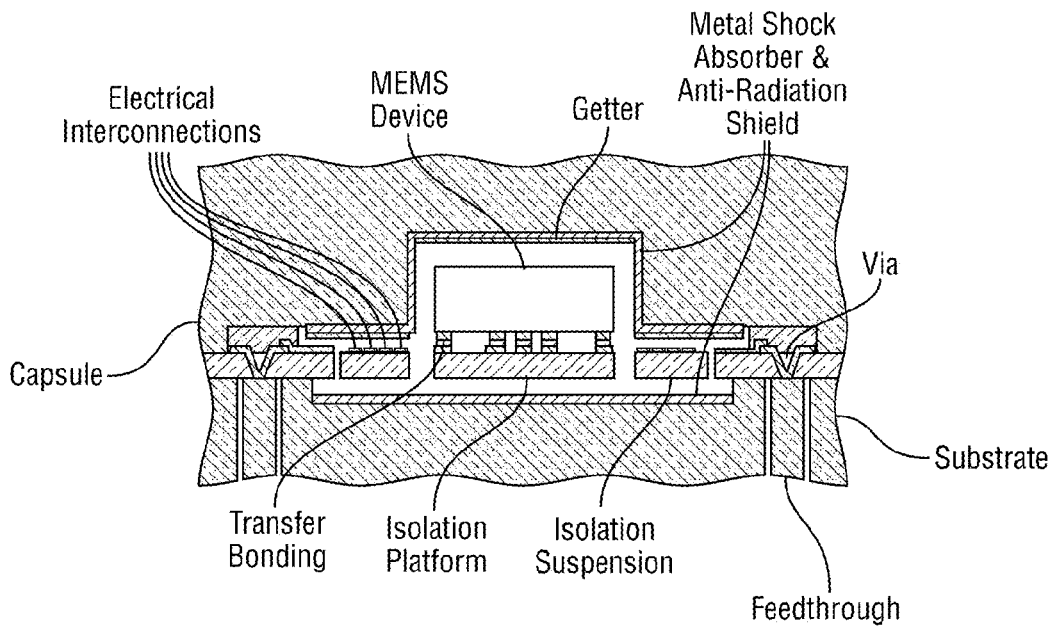
FIGS. 1a and 1b are schematic views of an environment-resistant microinstruments package constructed in accordance with at least one embodiment of the present invention.
Figure 1B:
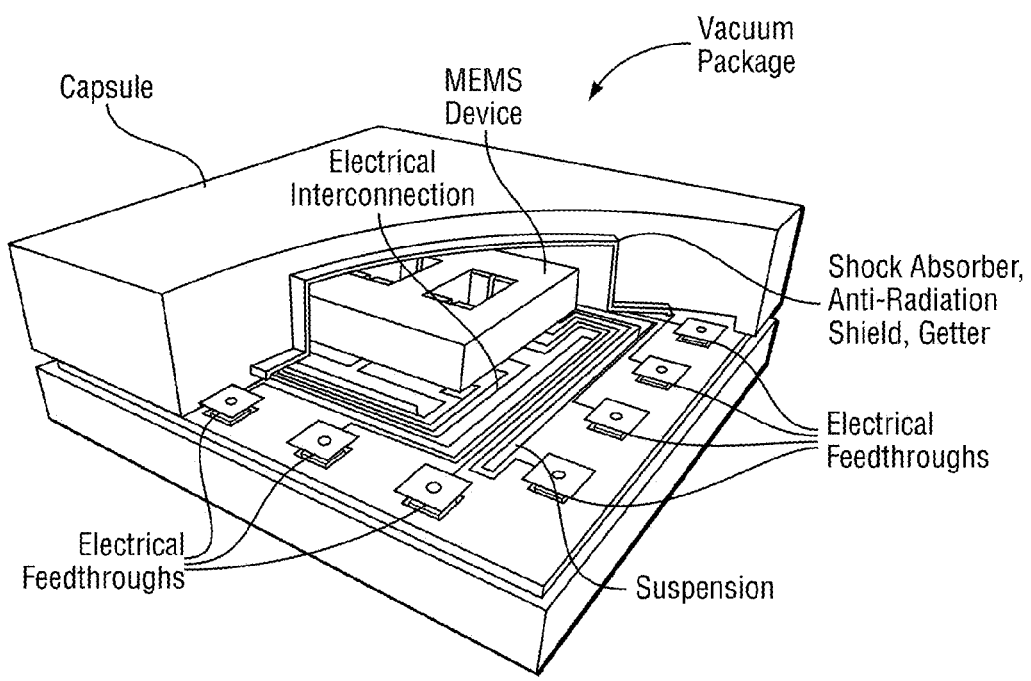

FIGS. 1a and 1b are schematic views of one embodiment of the package. The package typically has three major components and in at least one embodiment includes: (i) a supporting substrate such as a silicon wafer that may incorporate signal feedthroughs; (ii) a thin glass wafer which provides thermal and mechanical isolation using isolation suspensions made from the glass; and (iii) a cap silicon wafer or capsule for final vacuum/hermetic encapsulation if needed. In this approach, the MEMS die is flipped over and attached onto a glass microplatform, which is, in turn, supported by isolation suspensions over a shallow recess formed in the supporting silicon wafer substrate. Interconnect lines are formed on the glass suspension beams and transfer electrical signals between pads on the glass microplatform and vertical feedthroughs through the bottom silicon wafer. The attached MEMS die is oven-controlled by a heater and temperature sensor integrated on the microplatform and is thereby maintained at a fixed temperature. Vibration isolation is provided by the suspensions made of the glass.

The isolation suspensions should be stiff enough to mechanically support the platform and withstand shock/vibration, but long and flexible enough to provide thermal and vibration isolation. Both of these requirements are achieved using glass as the support and thermal isolation material. Glass has a relatively high Young's modulus and a low thermal conductivity. A thin (100 μm) glass wafer may be used to form these suspensions. The thin wafer is easy to etch and pattern using a batch-level wet etching process. Shock absorption layers [2], an anti-radiation shield for higher thermal isolation, and a getter layer for the high vacuum environment may also be formed inside the package [3].

The MEMS device is fabricated on a separate substrate, and transferred onto a support substrate that is an integral part of a second wafer. The transferred device is vacuum or hermetically sealed on top by a cap wafer. The electrical signal leads are defined vertically on the support substrate. The vertical feedthroughs can be formed on the cap wafer or capsule, and lateral feedthroughs are also possible.

The packages shown in FIGS. 1a and 1b can provide isolation from two different sources: mechanical and thermal input. Mechanical isolation is provided through two elements: isolation suspensions that damp out the low-level and higher frequency vibration signals, and shock stops that limit the range of travel of the transferred device during high g shocks. Thermal isolation is also provided by these isolation suspensions, which are designed and fabricated to have very high thermal resistance. A control method can be executed to keep temperature constant using a heater and a temperature sensor integrated on the isolation platform or on the MEMS dies. Since the devices are highly thermal-isolated, the power consumption for the constant temperature control is very low.

Glass tethers can be fabricated from a thin glass wafer, or from a thick glass wafer that is mechanically thinned, or from a thick deposited glass layer, or from a thick glass/oxide layer that is deposited on a semiconductor wafer using a number of different techniques.

Fabrication

Figure 2F:
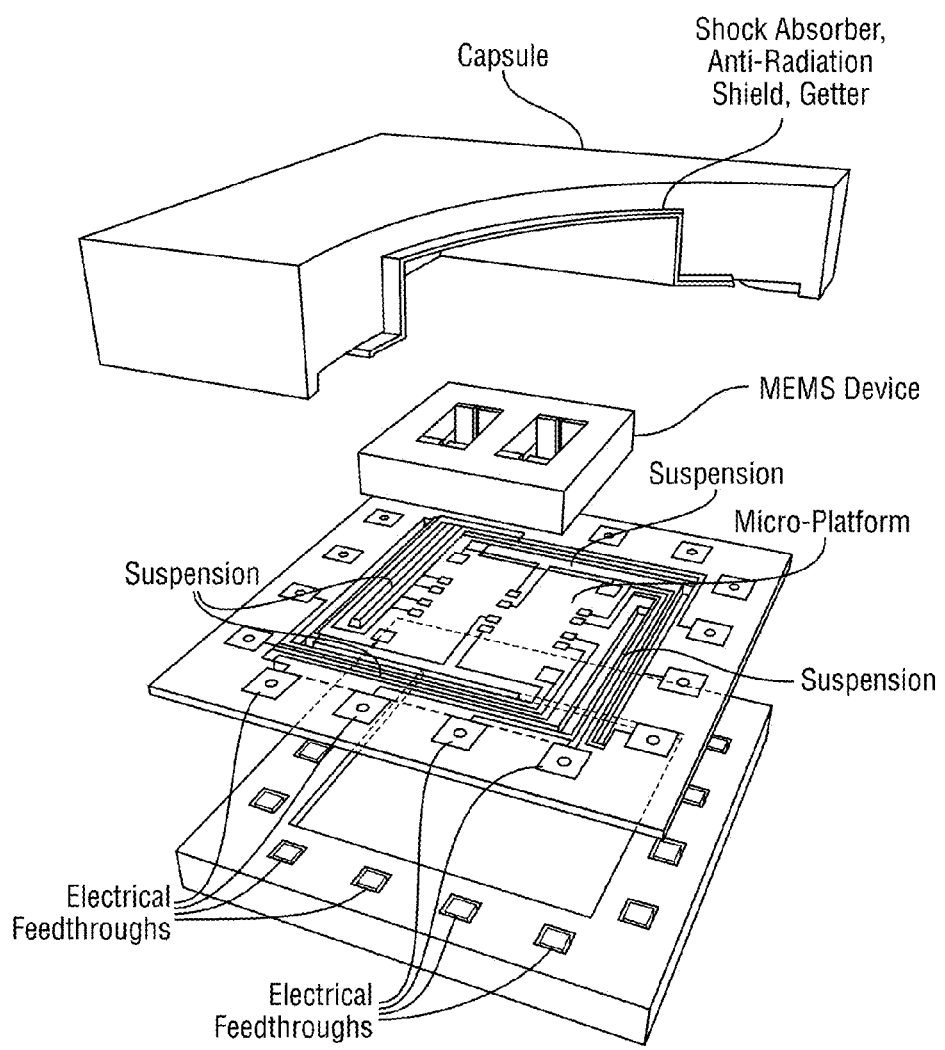
Figure 3A:
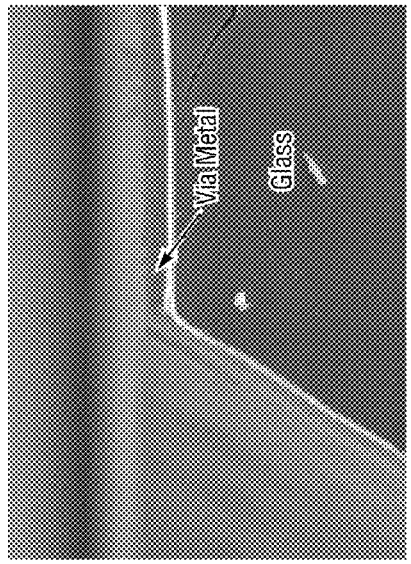
Figure 3B:
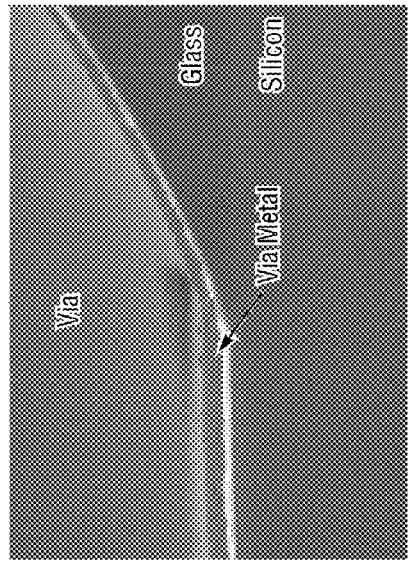
Figure 3B:
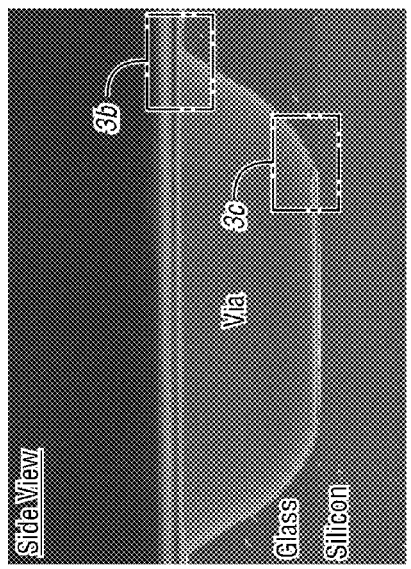
Figure 3C:
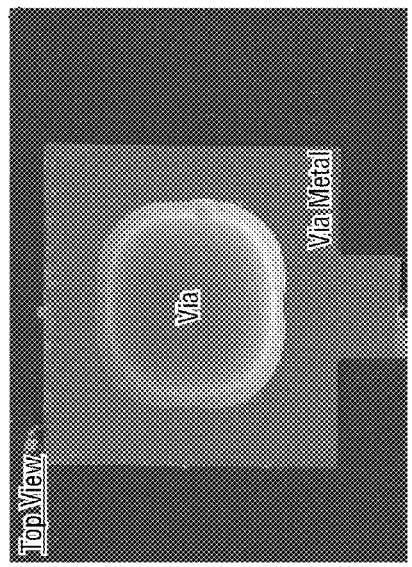

FIG. 2j is an exploded view of one embodiment of the package and FIGS. 2a-2i illustrate a corresponding process flow. This process can be divided into three major parts: (i) preparation of the supporting substrate, (ii) MEMS die transfer, (iii) final encapsulation and vertical feedthroughs formation.

Supporting Substrate Fabrication

Referring to FIG. 2a, a shallow recess is formed in a standard thickness, highly-doped supporting silicon wafer using DRIE (Deep Reactive Ion Etching), and a metal layer for shock absorption layer as well as anti-radiation shield is deposited inside the recess. Gold is typically used because it is soft and highly reflective [2]. The silicon wafer is then anodically bonded to a 100 μm-thick glass wafer as shown in FIG. 2b.

Referring to FIGS. 2c and 2d, via holes for the vertical feedthroughs are first wet etched into the glass wafer using a 49% HF solution, and then filled with a metal film as further shown in FIGS. 3a-3d. The via holes are filled by the metal layer. Good conformal coverage is shown. The measured contact resistance between the contact metal and the highly doped silicon substrate shows ohmic characteristics with less than 2 ohm resistance. By this via and feedthrough structure, the footprint of the package can be reduced. A lateral feedthrough instead of the vertical feedthrough can also be applied in this package.

Referring to FIG. 2e, metal interconnection lines between the vias and the bonding pads on the platform are then defined. Finally, the isolation platform and suspensions are patterned by wet etching the glass using a 49% HF solution as shown in FIG. 2f.

In summary, first, a bottom recess is formed on the support bottom wafer, and the shock absorption and radiation shield layer is deposited. It is then bonded with another glass wafer, out of which isolation suspension will be formed. For the vertical feedthrough interconnection, via holes are made by etching the glass wafer. The electrical interconnection lines are defined and then the isolation suspensions are patterned.

MEMS Transfer Process

Before transferring the MEMS dies, suitable metal layers are deposited on the MEMS die using a shadow mask process. The shadow mask may be made of patterned SU8 film on a silicon wafer with several holes, each of which corresponds to each of the bonding pads on the MEMS die.

Figure 7A:
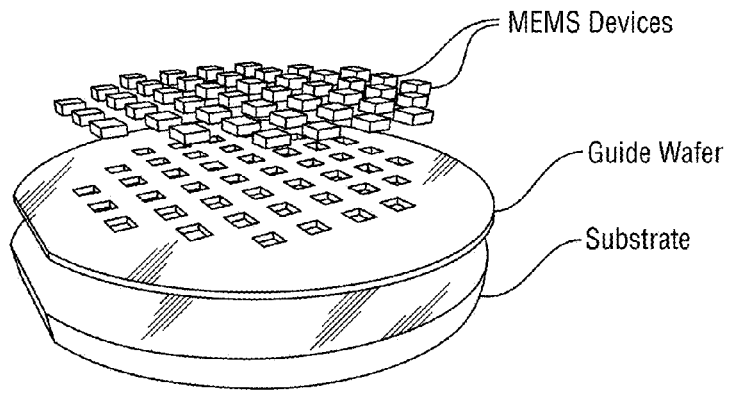
FIG. 7a is an exploded perspective view illustrating a portion of the transfer process and FIGS. 7b-7f are side schematic views illustrating the batch die-level transfer method.
Figure 7B:
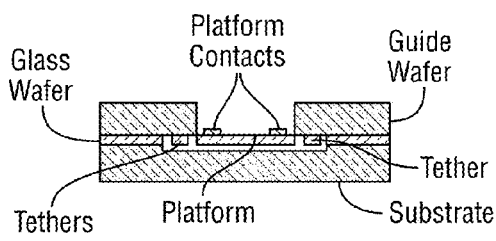
Figure 7C:
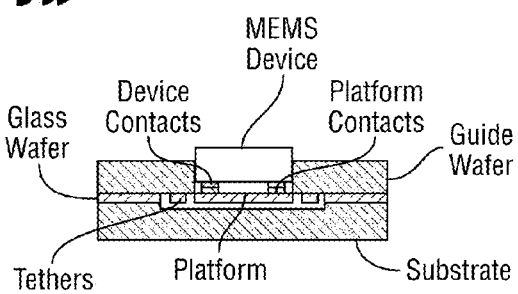
Figure 7D:
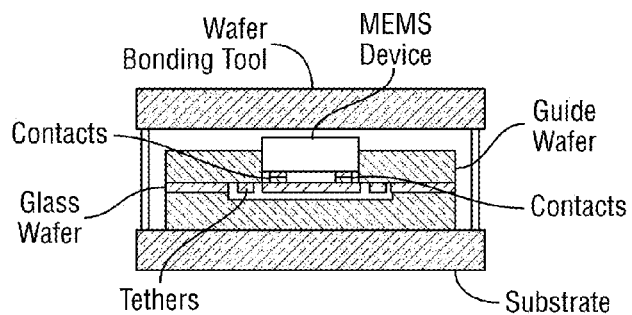
Figure 7E:
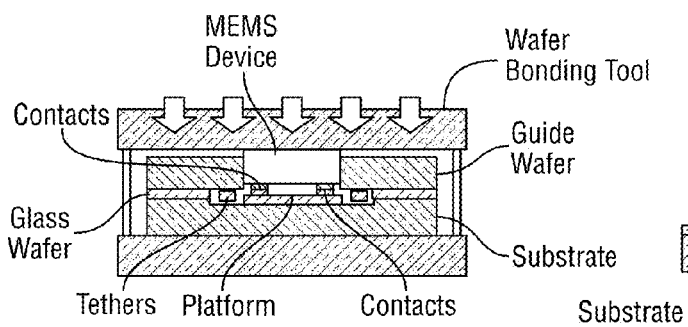
Figure 7F:
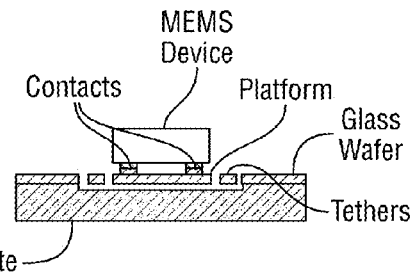

Referring to FIG. 2g, MEMS dies are then flipped over and bonded to the pads on the glass isolation platform using transient liquid phase (TLP) bonding [4]. The process sequence and results are shown in FIGS. 7a-7f. The alignment of the MEMS dies to the substrate is done using a micromachined guide wafer of FIG. 7a. It has through-wafer holes where each of MEMS dies is placed. This transfer/bonding process is a batch process and could support any size and shape die. The glass platform is supported using the flexible glass suspensions (FIG. 7b). It is flexible enough so when the die is being bonded to the platform it bends and touches down on the bottom silicon wafer (i.e., FIG. 7e), but it springs back up due to the high stiffness of the suspensions (i.e., FIG. 7f. The guide wafer is removed after die attach and bonding. All transfer/bonding process is done using standard wafer bonding equipment including a standard wafer bonding tool (FIGS. 7d and 7e).

This transfer technique has several advantages. First, it is generic. Therefore, any kind of MEMS device can be assembled since the dies are transferred after they are fabricated using any given process. Second, the electrical and mechanical connections between the isolation platform and the MEMS die are performed at the same time. Third, it provides flexibility to both the MEMS device and the bonding pad material selection since the materials required for bonding are deposited after the MEMS device fabrication. In addition to various kinds of TLP bonding, other die attachment approaches, such as thermo compression and solder bonding can also be used. A requirement may be that the die attach bond should survive the temperature of the bonding step described hereinbelow to achieve hermetic/vacuum encapsulation.

In summary, the technique is generic, so that any device with different size, shape and contacts location can be transferred at a time; a precise alignment is possible during the transfer; the electrical connection between the isolation platform and the substrate is possible at the moment of the transfer bonding; and various bonding mechanism such as In—Au TLP, Au—Au thermal compression bonding can be used for the attachment of MEMS device to the platform.

Figure 4A:
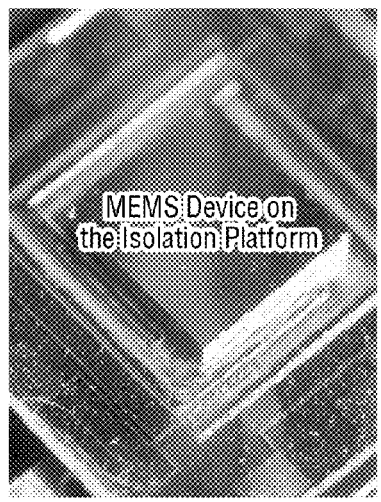
FIGS. 4a-4c are views or pictures of MEMS devices on isolation platforms; the isolation platforms are fully suspended by the isolation suspensions.
Figure 4B:
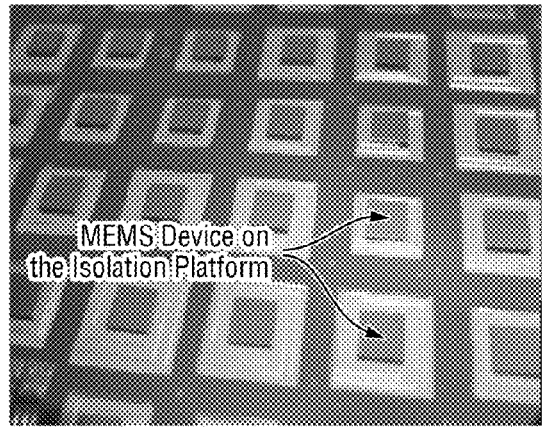
Figure 4C:
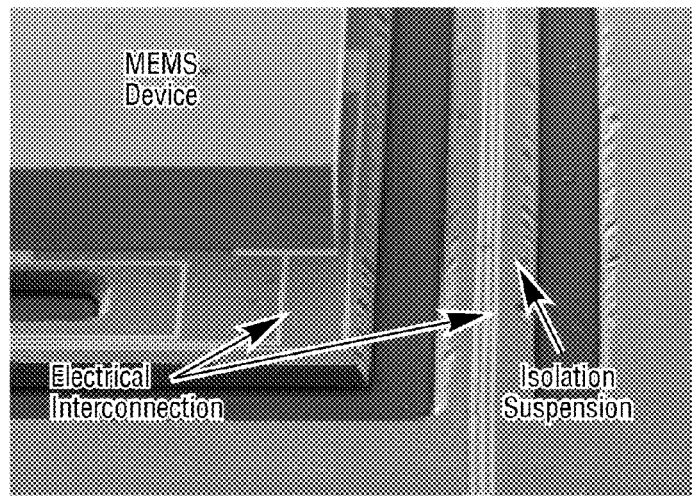

FIGS. 4a-4b show the isolation platform and the transferred die is shown in FIG. 4c which is a SEM image of the fabricated isolation suspension with electrical interconnection. The thin metal interconnections are patterned, and then the isolation suspension is defined. The suspension design provides thermal/mechanical isolation and electrical lead out.

Wafer-Level Encapsulation

Referring to FIG. 2h, vacuum/hermetic encapsulation is achieved using a cap or capsule bonded to the supporting substrate. This can be done using a variety of bonding techniques, including anodic and Au—Si eutectic bonding.

Figure 5B:
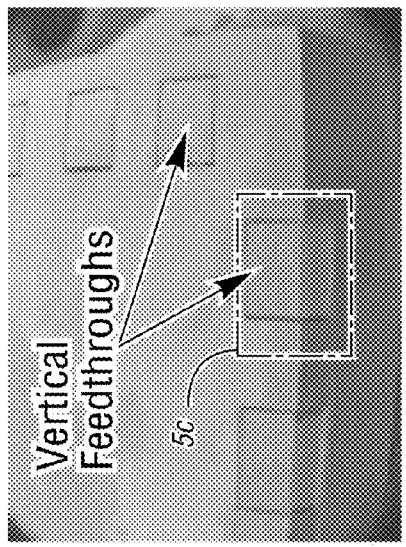
FIGS. 5b-5d are SEM pictures of vertical feedthroughs in the supporting substrate; the silicon feedthrough is electrically isolated by silicon DRIE.
Figure 5D:
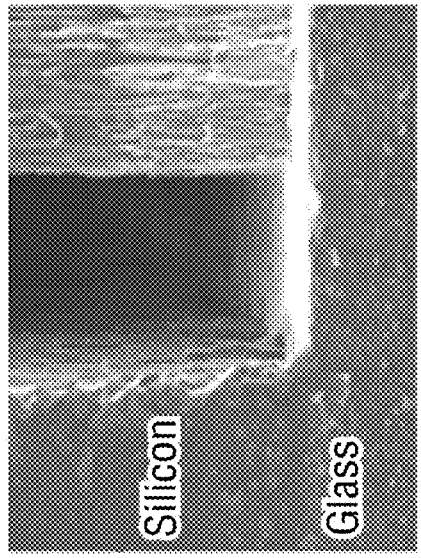
Figure 5A:
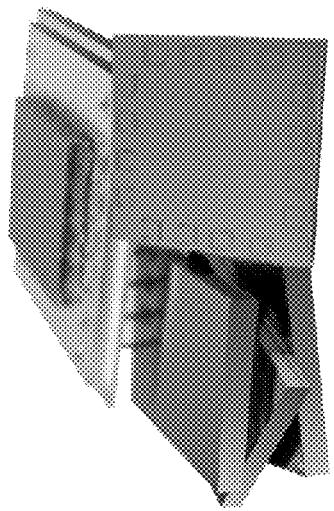
FIG. 5a is a picture of resulting packages.
Figure 5C:
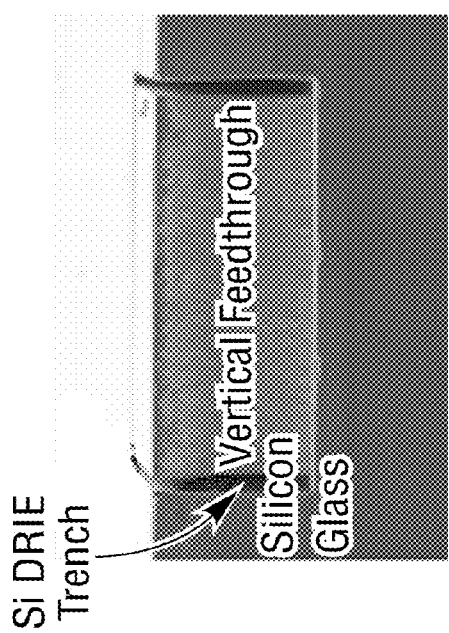

FIGS. 5a-5d shows the picture of the fabricated packages, and the SEM pictures of the vertical feedthrough, which is formed in the supporting substrate. The vertical feedthroughs are electrically isolated by silicon DRIE. Either wire-bonding or a flip-chip technique can be applied. The samples in FIG. 5a are fabricated using anodic bonding.

Referring to FIG. 2i, after vacuum packaging, the vertical feedthroughs are completed and formed by DRIE etching through the supporting silicon wafer from the backside. This vertical feedthrough technique reduces the footprint of the package, and, unlike lateral feedthroughs, enables the use of flip chip bonding of the die. The vertical feedthrough is very robust in that it shows no problem with wire bonding. The measured contact resistance is <2Ω (this is measured between the metal on the glass substrate to the bottom of the Si feedthrough, which is low enough for most applications).

Results

A thermal impedance of 3000 K/W has been measured for the isolation platform, which corresponds to a power consumption of 43 mW when the platform is oven-controlled at 80° C. and the external environment temperature is −50° C. The thermal isolation can be modified and improved as needed for different applications. The resonant frequency of the platform after a 4.5×4.5×0.5 mm$^3$ MEMS die is transferred and attached to the platform has been calculated to be <1 kHz. This resonant frequency can be designed to suit a particular application for vibration isolation. The vacuum and hermeticity of the package is determined by the bonding techniques. For example Au—Si eutectic bonding has been shown to provide sub-10 mTorr vacuum with <2 mTorr variation for almost two years [3].

Conclusion

A new, robust, and generic way of packaging MEMS for isolation against environmental parameters has been developed. Thermal and mechanical isolations are achieved simultaneously using glass isolation suspensions. The packaging technology allows for both wafer-level and die-level packaging of MEMS devices, and can handle a wide variety of MEMS chips. The package is capable of both hermetic and vacuum encapsulation, and provides vertical feedthroughs through the package substrate to save space. This approach is suitable for many different MEMS devices, including high performance gyroscopes, accelerometers, infrared imagers, or any applications requiring low power temperature control, vibration isolation, and hermetic/vacuum packaging for stable operation.

Elements and Variants

The environment-resistant MEMS package can be broken down into key elements. FIGS. 8a-8h show each element of the developed technology with boxes in phantom lines. Also, FIGS. 8a-8h show other possibilities that can be derived from the technology that has been developed.

Figure 8A:
FIGS. 8a-8h are side sectional views illustrating various aspects of the package with boxes in phantom.

FIG. 8a shows vacuum/hermetic encapsulation by a silicon-insulator (glass)-silicon structure. The bonding method can be various such as anodic bonding, solder bonding, intermetallic bonding, etc.

Figure 8B:
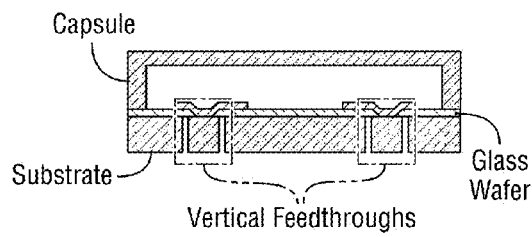

FIG. 8b shows vertical feedthroughs using vias through the insulating layer (glass) and silicon substrate isolation. Metal is filled in the vias for the electrical interconnection. The feedthroughs can be located in either the support substrate or the cap wafer.

Figure 8C:
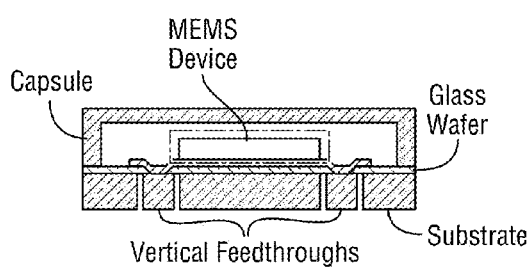

FIG. 8c shows the generic die-to-wafer transfer and assembly method.

Figure 8D:
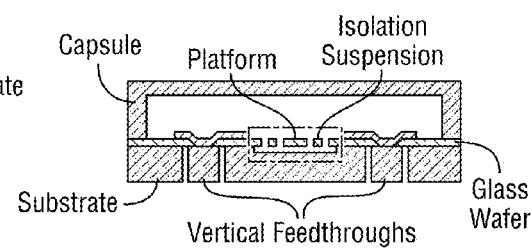

FIG. 8d shows thermal and vibration isolation by the isolation suspensions.

Figure 8E:
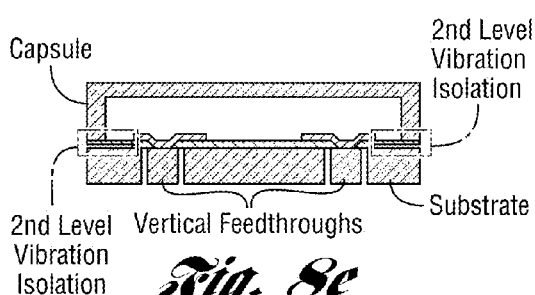

FIG. 8e shows 2$^{nd}$-level vibration isolation by suspensions formed out of a supporting wafer.

Figure 8F:
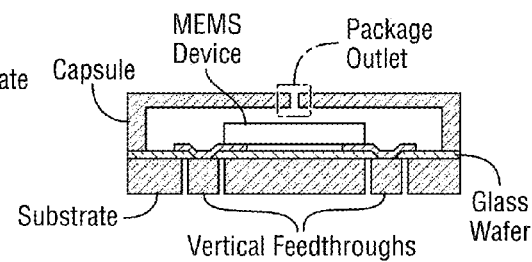

FIG. 8f shows packaging (encapsulation) with an outlet for communicating between the packaged device and the environment. This may be for pressure sensor and microphone applications.

Figure 8G:
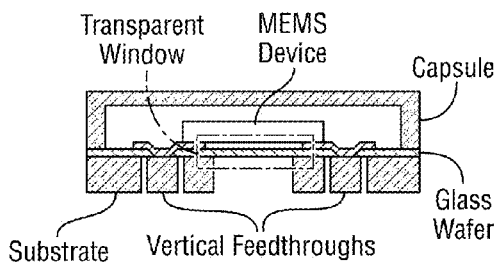

FIG. 8g shows packaging (encapsulation) with a transparent window. Image sensor and IR sensor are possible applications.

Figure 8H:
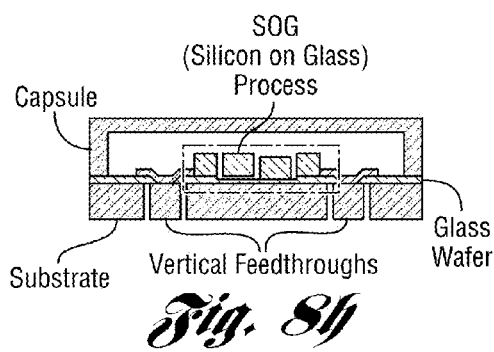

FIG. 8h shows an integrated silicon-on-glass (SOG) process.

Any possible combination of above, for example, the encapsulation of FIG. 8f and the SOG of FIG. 8h.

FIGS. 9a and 9b show potential modifications of the isolation platform and suspensions. Instead of using a glass wafer for both platform and suspension material, it is possible to form the isolation platform out of a Si wafer and the isolation suspension out of a dielectric film (possibly thin glass wafer). As shown in the figures, the isolation suspension can be located at the top or bottom of the isolation platform.

Figure 6A:
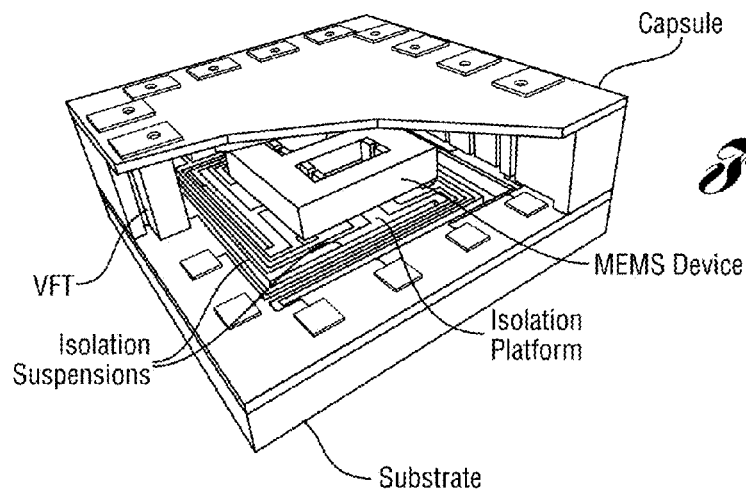
FIG. 6a is a schematic perspective view, partially broken away, of a package with a vertical feedthrough on the cap wafer; the cap part or capsule may be made of a silicon-glass bonded wafer wherein a via is patterned by a wet process.
Figure 6B:
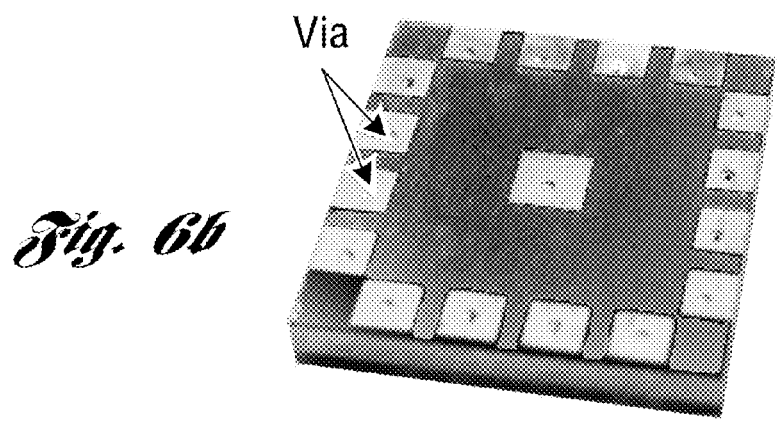
FIGS. 6b and 6c are pictures of silicon vertical feedthroughs which are electrically isolated by DRIE trenches.
Figure 6C:
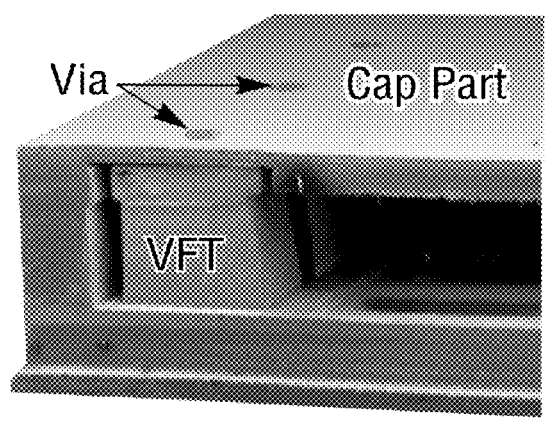

FIGS. 9c and 9d and FIGS. 6a-6c show potential modification of the vertical feedthroughs. The vertical feedthroughs can be formed in the cap wafer or capsule. Dielectric film (possibly thin glass wafer) for electrical isolation between vias can be located either at the top or bottom of the cap wafer as shown in FIGS. 9c and 9d, respectively. The vertical feedthroughs can be fabricated in the cap wafer (top vertical feedthrough) using the same technique used in forming the bottom vertical feedthroughs. FIG. 6a is a schematic perspective view showing the fabricated package with top vertical feedthroughs. In this case, via holes are exposed on the outside of the package.

Although individual dies and transfers are shown, the technology will also work with full wafers containing actual MEMS devices. A device wafer would be bonded, for example, to the platform substrate and then the device wafer would be diced or etched to singulate the individual dies.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An environment-resistant module including a packaged device, the module comprising:
    a device;
    a package having an inner surface which forms a cavity and an outer surface which communicates with the environment;
    a microplatform located within the cavity, the device being supported on the microplatform;
    a flexible support structure to support the microplatform and the device within the cavity; and
    an outer region of material about the support structure and supporting the support structure;
    wherein the microplatform and the support structure provide physical isolation of the device, and wherein the microplatform, the support structure, and the outer region of material are substantially planar in a lateral direction and are all at least partially defined by a single planar layer of insulative material.

2. The module as claimed in claim 1, wherein the support structure is manufactured from at least one material having high thermal resistance to provide the microplatform with thermal isolation.

3. The module as claimed in claim 2, further comprising a heater and a temperature sensor disposed on the microplatform.

4. The module as claimed in claim 3, further comprising electrical interconnections coupled to the heater or the temperature sensor, or both, to power the heater or temperature sensor, or both.

5. The module as claimed in claim 4, wherein both the microplatform and the support structure are substantially planar in a lateral direction.

6. The module as claimed in claim 4, further comprising at least one feedthrough through the package to electrically connect the device to the environment.

7. The module as claimed in claim 6, wherein the at least one feedthrough includes a vertical feedthrough.

8. The module as claimed in claim 1, wherein the package has a relatively low profile.

9. The module as claimed in claim 1, wherein both the microplatform and the support structure are manufactured from a single substrate of glass.

10. The module as claimed in claim 1, wherein both the microplatform and the support structure are manufactured from a single thermally conductive substrate.

11. The module as claimed in claim 1, wherein the microplatform and the support structure provide thermal isolation of the device.

12. The module as claimed in claim 1, wherein the microplatform and the support structure provide vibration isolation of the device.

13. The module as claimed in claim 1, wherein the single planar layer of material is a thin glass wafer.

14. The module as claimed in claim 1, wherein the device is a heater.

15. The module as claimed in claim 1, wherein the device is a temperature sensor.

16. The module as claimed in claim 1, further comprising electrical interconnections above the support structure connected to the device.

17. A method of making a packaged device, the method comprising:
providing a device;
providing a package having an inner surface which forms a cavity and an outer surface which communicates with the environment; and
out of a single substantially planar layer of insulative material, batch fabricating (i) a microplatform located within the cavity to support the device, (ii) a support structure to support the microplatform, and (iii) an outer region of material about the support structure and supporting the support structure, wherein the microplatform and the support structure provide physical isolation of the device.

18. The method as claimed in claim 17, wherein the device is a micromachined or MEMS device.

19. The method as claimed in claim 17, wherein the microplatform and the support structure provide thermal isolation of the device.

20. The method as claimed in claim 17, wherein the microplatform and the support structure provide vibration isolation of the device.

21. An environment-resistant module including a packaged device, the module comprising:
a device;
a package having an inner surface which forms a cavity;
a microplatform located within the cavity for supporting the device;
a plurality of suspensions supporting the microplatform within the cavity; and
an outer region of material about the suspensions and supporting the suspensions;
wherein the microplatform, the suspensions, and the outer region of material are substantially planar in a lateral direction and are all at least partially defined by a single planar layer of insulative material.

* * * * *